United States Patent
Dougakiuchi et al.

(10) Patent No.: US 12,176,681 B2
(45) Date of Patent: Dec. 24, 2024

(54) OPTICAL KIT AND OPTICAL DEVICE

(71) Applicant: HAMAMATSU PHOTONICS K.K., Hamamatsu (JP)

(72) Inventors: Tatsuo Dougakiuchi, Hamamatsu (JP); Yoichi Kawada, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 636 days.

(21) Appl. No.: 17/439,884

(22) PCT Filed: Jan. 14, 2020

(86) PCT No.: PCT/JP2020/000929
§ 371 (c)(1),
(2) Date: Sep. 16, 2021

(87) PCT Pub. No.: WO2020/195023
PCT Pub. Date: Oct. 1, 2020

(65) Prior Publication Data
US 2022/0181851 A1    Jun. 9, 2022

(30) Foreign Application Priority Data

Mar. 25, 2019 (JP) ................. 2019-056343

(51) Int. Cl.
| | |
|---|---|
| H01S 5/14 | (2006.01) |
| H01S 5/02325 | (2021.01) |
| H01S 5/34 | (2006.01) |

(52) U.S. Cl.
CPC .......... *H01S 5/141* (2013.01); *H01S 5/02325* (2021.01); *H01S 5/3401* (2013.01)

(58) Field of Classification Search
CPC .... H01S 5/141; H01S 5/02325; H01S 5/3401; H01S 3/0805; H01S 3/1055
See application file for complete search history.

(56) References Cited

U.S. PATENT DOCUMENTS 5,461,635 A * 10/1995 Basiev ................. H01S 3/0805
372/19
2003/0231691 A1   12/2003 Marron
(Continued)

FOREIGN PATENT DOCUMENTS

| CN | 105814476 A | 7/2016 |
|---|---|---|
| JP | H9-129982 A | 5/1997 |

(Continued)

OTHER PUBLICATIONS

Wysocki, G. et al., "Widely tunable mode-hop free external cavity quantum cascade lasers for high resolution spectroscopy and chemical sensing," Applied Physics B, Sep. 2008, vol. 92, pp. 305-311.
(Continued)

*Primary Examiner* — Xinning (Tom) Niu
(74) *Attorney, Agent, or Firm* — Faegre Drinker Biddle & Reath LLP

(57) ABSTRACT

An optical kit includes a base including a main surface; and a holding unit provided on the main surface to hold an optical system. The holding unit includes a lens holding unit that holds a lens, a reflector holding unit that holds a corner reflector, a first aperture member holding unit that holds a first aperture member, a second aperture member holding unit that holds a second aperture member, and a third aperture member holding unit that holds a third aperture member. The reflector holding unit includes a first mechanism that holds an entirety of the corner reflector so as to be rotatable along the main surface, and a second mechanism configured to adjust an optical axis of a diffracted light in each of a reflective diffraction grating and a mirror.

6 Claims, 12 Drawing Sheets

(56) References Cited

U.S. PATENT DOCUMENTS

| | | | |
|---|---|---|---|
| 2007/0030865 A1* | 2/2007 | Day | H01S 5/02216 372/4 |
| 2008/0298406 A1* | 12/2008 | Day | H01S 5/141 372/39 |
| 2009/0028197 A1 | 1/2009 | Arnone et al. | |
| 2009/0323737 A1 | 12/2009 | Ensher et al. | |
| 2010/0002734 A1 | 1/2010 | Pushkarsky et al. | |
| 2012/0268743 A1* | 10/2012 | Wang | B82Y 20/00 356/417 |
| 2017/0222401 A1* | 8/2017 | Zimer | H01S 5/405 |

FOREIGN PATENT DOCUMENTS

| | | |
|---|---|---|
| JP | 2001-284684 A | 10/2001 |
| JP | 2002-525856 A | 8/2002 |
| JP | 2005-045195 A | 2/2005 |
| JP | 2006-107611 A | 4/2006 |
| JP | 2007-150028 A | 6/2007 |
| JP | 2012-178436 A | 9/2012 |
| JP | 2017-519367 A | 7/2017 |
| WO | WO-00/016453 A1 | 3/2000 |
| WO | WO-2015/185900 A1 | 12/2015 |
| WO | WO 2016/080252 A1 | 5/2016 |

OTHER PUBLICATIONS

International Preliminary Report on Patentability mailed Oct. 7, 2021 for PCT/JP2020/000929.

\* cited by examiner

OPTICAL KIT AND OPTICAL DEVICE

TECHNICAL FIELD

The present disclosure relates to an optical kit and an optical device.

BACKGROUND ART

Non Patent Literature 1 describes an external cavity quantum cascade laser system. This laser system includes a quantum cascade laser, a collimating lens that collimates a laser beam from the quantum cascade, a diffraction grating that reflects a $0^{th}$ order diffracted light of the laser beam from the collimating lens in a predetermined direction, and a mirror that further reflects the $0^{th}$ order diffracted light from the diffraction grating. The diffraction grating and the mirror are mounted on a common rotatable platform. Extension lines of a reflective surface of the diffraction grating and a reflective surface of the mirror are set to exactly intersect each other at a rotation axis of the platform.

CITATION LIST

Non Patent Literature

Non Patent Literature 1: R. Wysockil, R. Lewicki, R. F. Curl, F. K. Tittel, L. Diehl, F. Capasso, M. Troccoli, G. Hofler, D. Bour, S. Corzine, R. Maulini, M. Giovannini, J. Faist, "Widely tunable mode-hop free external cavity quantumcascade lasers for high resolution spectroscopy and chemical sensing" Applied Physics B, September 2008, Volume 92, Issue 3, pp 305-311

SUMMARY OF INVENTION

Technical Problem

Since the above-described configuration of the laser system is adopted, the position and the direction of the output laser beam can be fixed during wavelength tuning process. In the operation of such a laser system, in a case where a user replaces the laser light source to change the wavelength band, when the position and the direction of the output light deviate, it is necessary to adjust an optical system in a subsequent stage accordingly. Therefore, the restoring of the position and the direction of the emitted light may be required on a laser system side even after the replacement of the laser light source. However, it is not easy to adjust an optical axis of the emitted light at the same time while performing fine adjustment to establish an external resonator. Further, when it is necessary to replace the diffraction grating at the same time to correspond to the replaced laser light source, since exact alignment is also required to fix the position and the direction of the emitted light during wavelength tuning process, the adjustment is more difficult. Incidentally, when an invisible light such as a mid-infrared light is dealt with as in Non Patent Literature 1, the adjustment is particularly difficult.

An object of the present disclosure is to provide an optical kit with which the position and the direction of an output light can be easily adjusted, and an optical device.

Solution to Problem

An optical kit according to the present disclosure is an optical kit forming an optical system including an external resonator of a laser light source that outputs a laser light, the kit including: a base including a main surface; and a holding unit provided on the main surface and configured to hold the optical system. The optical system includes a lens into which the laser light is input in a first direction, a corner reflector including a reflective diffraction grating conjured to reflect a diffracted light of the laser light, which has passed through the lens, in a second direction intersecting the first direction, and a mirror configured to reflect the diffracted light from the reflective diffraction grating in a third direction opposite to the first direction, a first aperture member disposed to form an optical aperture through which the laser light which has passed through the lens passes when the corner reflector is not installed, a second aperture member and a third aperture member arranged in the third direction to form optical apertures through which the diffracted light from the corner reflector passes in order. The holding unit includes a lens holding unit configured to hold the lens, a reflector holding unit configured to hold the corner reflector, a first aperture member holding unit configured to hold the first aperture member, a second aperture member holding unit configured to hold the second aperture member, and a third aperture member holding unit configured to hold the third aperture member. The reflector holding unit includes a first mechanism configured to hold an entirety of the corner reflector so as to be rotatable along the main surface, and a second mechanism configured to adjust an optical axis of the diffracted light in each of the reflective diffraction grating and the mirror.

The position and the direction of an output light can be adjusted as follows by using this optical kit. Namely, first, the optical components of the optical system except for the corner reflector are held by the respective holding units except for the reflector holding unit among the holding units. In addition, the laser light source is installed such that the laser light output from the laser light source passes through the optical aperture of the first aperture member, which is held by the first aperture member holding unit, via the lens held by the lens holding unit. Next, while monitoring the light intensity of the laser light that has passed through the optical aperture of the first aperture member, the position of the laser light source with respect to the lens is adjusted such that the maximum value of the light intensity can be obtained.

Accordingly, the alignment between a light emitting point of the laser light source and the center of the lens is achieved. The center of the lens and the center of the optical aperture of the first aperture member can be aligned with one straight line in the range of machining accuracy of the base and the holding unit. Therefore, an optical axis of the laser light which is output from the laser light source and passes through the lens is aligned with the one straight line by the above step.

Next, the corner reflector held by the reflector holding unit. Then, while monitoring the light intensity of the diffracted light that has passed through the optical aperture of the second aperture member via the corner reflector, the optical axis of the diffracted light from the reflective diffraction grating is adjusted by the second mechanism such that the maximum value of the light intensity can be obtained. When the maximum value of the light intensity of the diffracted light which has passed through the optical aperture of the second aperture member is obtained, the optical aperture of the second aperture member is sufficiently expanded or the second aperture member is removed for the moment, and then while monitoring the light intensity of the diffracted light that has passed through the optical aperture of the third aperture member via the corner reflector, the optical axis of the diffracted light from the mirror is adjusted by the second mechanism such that the maximum value of the light intensity can be obtained. The center of the optical aperture of the second aperture member and the center of the optical aperture of the third aperture member can be aligned with another straight line parallel to the one straight line in the range of machining accuracy of the base and the holding unit. Therefore, the optical axis of the diffracted light which has passed through the optical apertures of the second aperture member and the third aperture member can be aligned with the another straight line by alternately repeating adjustment of the optical axis of the diffracted light while monitoring the intensity of the diffracted light which has passed through the optical aperture of the second aperture member and adjustment of the optical axis of the diffracted light while monitoring the intensity of the diffracted light which has passed through the optical aperture of the third aperture member.

As a result of these adjustments, the optical axis of the laser light which is output from the laser light source and passes through the lens and the optical axis of the diffracted light which passes through the optical apertures of the second aperture member and the third aperture member via the corner reflector can be aligned with two respective straight lines parallel to each other. Accordingly, orthogonality between a reflective surface of the reflective diffraction grating and a reflective surface of the mirror is guaranteed, and the position and the direction of the output light (diffracted light) are fixed when the wavelength of the output light is selected by rotating the corner reflector using the first mechanism. As described above, according to this optical kit, the position and the direction of the output light can be easily adjusted, and the configuration can be easily realized in which the position and the direction of the output light are fixed when the wavelength of the output light is selected.

In the optical kit according to the present disclosure, the second mechanism may hold the reflective diffraction grating and the mirror so as to be rotatable around respective rotation axes along the main surface independently of each other, so that the optical axis of the diffracted light is adjustable. As described above, the reflective diffraction grating and the mirror are held so as to be rotatable around the respective rotation axes along the main surface independently of each other, so that the optical axis of the diffracted light is adjustable.

In the optical kit according to the present disclosure, the reflector holding unit may further include a third mechanism configured to hold the reflective diffraction grating such that the reflective diffraction grating does not rotate along the main surface, and configured to hold the mirror such that the mirror independently rotates along the main surface. In this case, the optical axis of the diffracted light from the mirror can be adjusted while suppressing an unintended change in wavelength of the diffracted light.

In the optical kit according to the present disclosure, the reflector holding unit may further include a fourth mechanism that holds the corner reflector so as to be movable along the second direction. In this case, the degree of freedom in adjusting the optical axis of the diffracted light emitted from the corner reflector is improved.

The optical kit according to the present disclosure may further include a light source holding unit configured to hold the laser light source. In this case, when the laser light source is replaced, the positioning of the laser light source is facilitated, and alignment between the light emitting point of the laser light source and the center of the lens is facilitated.

An optical device according to the present disclosure includes the optical kit; the lens held by the lens holding unit; the corner reflector held by the reflector holding unit; the first aperture member held by the first aperture member holding unit; the second aperture member held by the second aperture member holding unit; and the third aperture member held by the third aperture member holding unit. According to the optical device, for the above-described reason, the position and the direction of an output light can be easily adjusted, and the configuration can be easily realized in which the position and the direction of the output light are fixed when the wavelength of the output light is selected.

Advantageous Effects of Invention

According to the present disclosure, it is possible to provide the optical kit with which the position and the direction of the output light can be easily adjusted, and the optical device.

DESCRIPTION OF EMBODIMENTS

Figure 1:
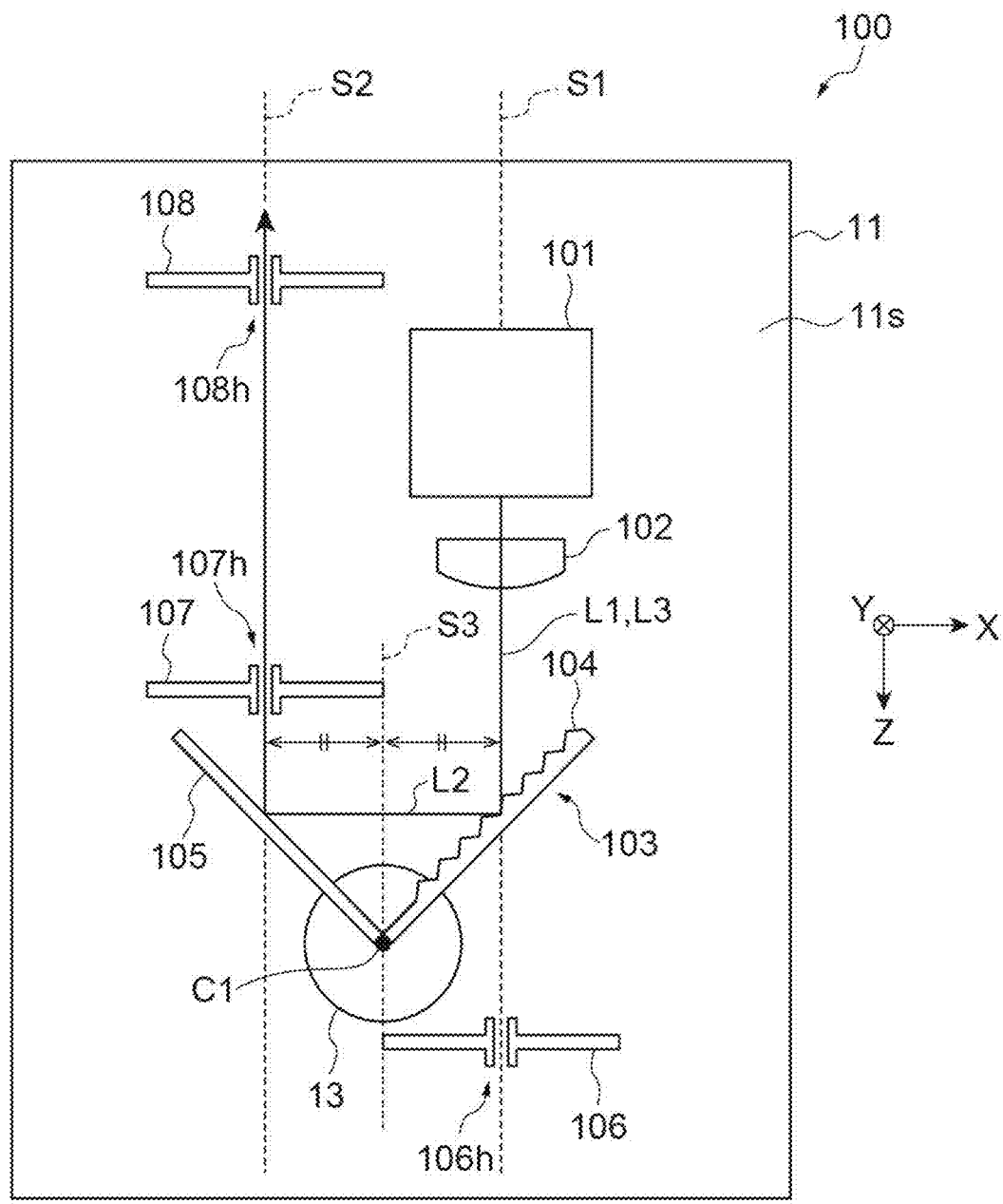
FIG. 1 is a schematic plan view illustrating a laser device according to the present embodiment.

Hereinafter, one embodiment will be described in detail with reference to the drawings. Incidentally, in the drawings, the same components or equivalent components are denoted by the same reference signs, and duplicated descriptions may be omitted. In addition, in each drawing, the rectangular coordinate system defined by an X-axis, a Y-axis, and a Z-axis may be illustrated.

Figure 2:
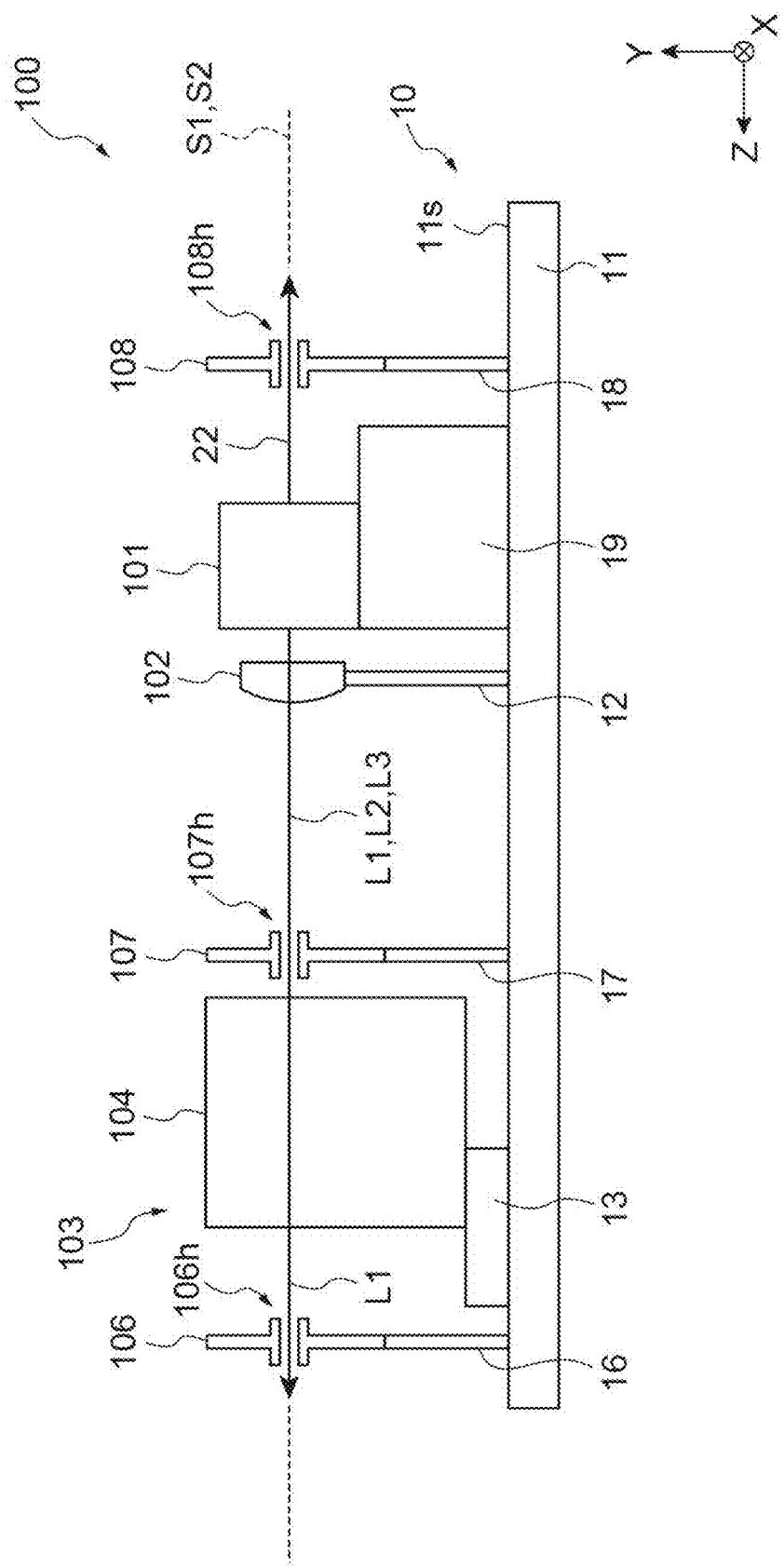
FIG. 2 is a schematic side view of the laser device illustrated in FIG. 1.

FIG. 1 is a schematic plan view illustrating a laser device according to the present embodiment. FIG. 2 is a schematic side view of the laser device illustrated in FIG. 1. As illustrated in FIGS. 1 and 2, a laser device (optical device) 100 includes a laser light source 101, a lens 102, a corner reflector 103, an iris (first aperture member) 106, an iris (second aperture member) 107, and an iris (third aperture member) 108. The corner reflector 103 includes a reflective diffraction grating 104 and a mirror 105.

In the laser device 100, a straight line S1, a straight line S2, and a straight line S3 are defined. The straight lines S1, S2, and S3 are virtual lines. The straight line S1, the straight line S2, and the straight line S3 are parallel to each other when seen in an X-axis direction (a negative direction is a second direction) and a Y-axis direction. The straight lines S1 to S3 are along a Z-axis direction (a positive direction is a first direction and a negative direction is a third direction). The distances to the straight line S1 and the straight line S2 from the straight line S3 are equidistant. In other words, the straight line S3 passes through the middle between the straight line S1 and the straight line S2.

The laser light source 101 is not particularly limited, and is a quantum cascade laser as one example. The laser light source 101 outputs a laser light L1. The wavelength of the laser light L1 is, for example, from 3 µm to 15 µm. The lens 102 receives and collimates the laser light L1, which has been output from the laser light source 101, in a Z-axis positive direction (first direction). When the laser light source 101 is the quantum cascade laser, the lens 102 is, for example, an aspherical lens made of a material such as ZnSe or Ge. As one example, a low reflection coating is applied to a laser light source 101 side surface of the lens 102 and a surface opposite thereto. A light emitting point of the laser light source 101 and a center point of the lens 102 are substantially aligned with each other, and are located on the straight line S1.

The laser light L1 emitted from the lens 102 is incident on the corner reflector 103. The laser light L1 incident on the corner reflector 103 is incident on the reflective diffraction grating 104. The incidence position of the laser light L1 on the reflective diffraction grating 104 is an intersection point of a reflective surface 104s of the reflective diffraction grating 104 (refer to FIG. 3) and the straight line S1. In addition, as one example, the angle of incidence of the laser light L1 on the reflective surface 104s (angle formed by the straight line S1 and a line perpendicular to the reflective surface 104s) is 30°. The number of grooves per unit length, the shape of the grooves, or the like of the reflective diffraction grating 104 can be appropriately set according to the oscillation wavelength of the laser light source 101. When the laser light source 101 is the quantum cascade laser, for example, the number of grooves per 1 mm and the blaze wavelength can be set to 150 and 6 µm, respectively.

A $0^{th}$ order diffracted light L2 of the laser light L1 incident on the reflective diffraction grating 104, namely, the diffracted light L2 of the laser light L which has passed through the lens 102 is reflected in an X-axis negative direction (second direction). A first order diffracted light L3 of the laser light L1 incident on the reflective diffraction grating 104 is reflected in a Z-axis negative direction to be incident on the lens 102, condensed by the lens 102, and coupled to an end surface of the laser light source 101 which emits the laser light L1. Accordingly, an external resonator is formed between the laser light source 101 and the reflective diffraction grating 104.

The diffracted light L2 reflected in the X-axis negative direction by the reflective diffraction grating 104 is incident on the mirror 105. The incidence position of the diffracted light L2 on the mirror 105 is an intersection point of a reflective surface 105s of the mirror 105 (refer to FIG. 3) and the straight line S2. The reflective surface 104s of the reflective diffraction grating 104 and the reflective surface 105s of the mirror 105 are orthogonal to each other. The mirror 105 may have a reflectance of 90% or more to a light emitted from the laser light source 101. As one example, a flat gold mirror in which gold is applied to a surface by evaporation can be used as the mirror 105. The diffracted light L2 incident on the mirror 105, namely, the diffracted light L2 from the reflective diffraction grating 104 is reflected in the Z-axis negative direction (third direction).

The diffracted light L2 reflected by the mirror 105, namely, the diffracted light L2 from the corner reflector 103 passes through an optical aperture 107h of the iris 107 and an optical aperture 108h of the iris 108 in order. Namely, the irises 107 and 108 are arranged in the Z-axis negative direction to form the optical apertures 107h and 108h through which the diffracted light L2 from the corner reflector 103 passes in order. The optical aperture 107h of the iris 107 and the optical aperture 108h of the iris 108 face each other along the Z-axis direction (along the first direction and the third direction). The irises 106 to 108 are optical members that can adjust the diameter of a hole (size of the optical aperture) using a diaphragm, and may be the same as or different from each other. Meanwhile, the minimum diaphragm diameter of each of the irises 106 to 108 can be set to at least 1 mm or less from an intention to limit the spatial position of the optical axis of an invisible laser light in a certain range.

The iris 107 and the iris 108 are disposed such that the center of the optical aperture 107h and the center of the optical aperture 108h are aligned with each other on the straight line S2. The diffracted light L2 emitted from the iris 108 is output to the outside. The iris 106 is disposed such that when the corner reflector 103 is not installed, the laser light L1 which has passed through the lens 102 passes through an optical aperture 106h. The lens 102 and the optical aperture 106h of the iris 106 face each other along the Z-axis direction (along the first direction and the third direction). The iris 106 is disposed such that the center of the optical aperture 106h is aligned with both the light emitting point of the laser light source 101 and the center of the lens 102 on the straight line S1.

In the laser device 100, with the above configuration, the position and the direction of an output light (diffracted light L2) do not change when the wavelength of the output light is changed by the rotation of the corner reflector 103.

An optical kit 10 forms the laser device 100, namely, another optical system including the laser light source 101 and an external resonator of the laser light source 101. Subsequently, the optical kit forming the laser device 100 will be described. The optical kit 10 includes a base 11 including a main surface 11s and a holding unit that holds each above optical component. The base 11 has a flat plate shape, and is integrally formed. Incidentally, an uneven structure may be formed in the base 11. In this case, the main surface 11s includes a plurality of surfaces that are top surfaces of a plurality of protrusions of the uneven structure and face one side. In this case, the plurality of surfaces forming the main surface 11s may be parallel to each other. The holding unit includes a holding unit (lens holding unit) 12 that holds the lens 102, a holding unit (reflector holding unit) 13 that holds the corner reflector 103, a holding unit (first aperture member holding unit) 16 that holds the iris 106, a holding unit (second aperture member holding unit) 17 that holds the iris 107, a holding unit (third aperture member holding unit) 18 that holds the iris 108, and a holding unit (light source holding unit) 19 that holds the laser light source 101.

The straight lines S1 to S3 are located in a plane parallel to the main surface 11s of the base 11. In other words, the holding unit 12, the holding units 16 to 18, and the holding unit 19 hold the lens 102, the irises 106 to 108, and the laser light source 101, respectively, such that the heights of the center of the lens 102, the centers of the optical apertures 106h to 108h, and the light emitting point of the laser light source 101 from the main surface 11s coincide with each other. The holding unit 12 and the holding unit 16 are disposed along the Z-axis direction (along the first direction and the third direction). The holding unit 17 and the holding unit 18 are disposed along the Z-axis direction (along the first direction and the third direction). The holding units 16 to 18 may be the same as each other. In addition, the heights of the holding units 16 to 18 from the main surface 11s may be the same as each other. In this case, since the holding units 16 to 18 are the same (have the same height), when irises (aperture members) having the same shape are used, the heights of the centers of optical apertures can coincide with each other in the range of machining accuracy.

Figure 3:
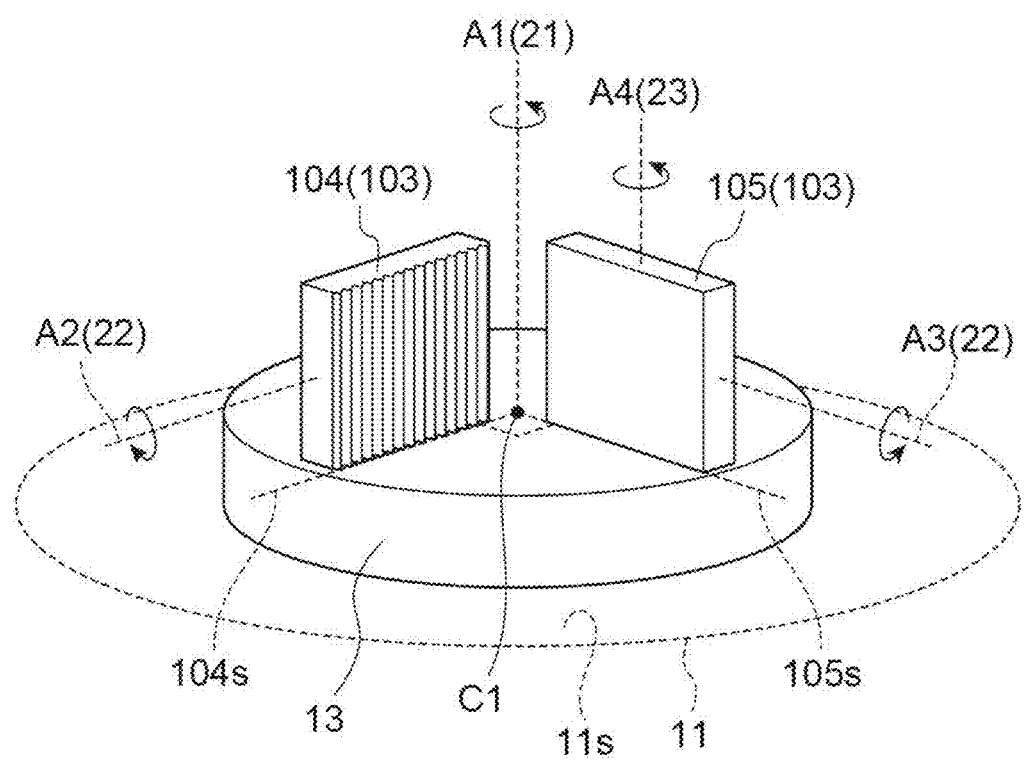
FIG. 3 is a perspective view illustrating one holding unit illustrated in FIG. 2.

FIG. 3 is a perspective view illustrating the holding unit (that holds the corner reflector) illustrated in FIG. 2. As illustrated in FIG. 3, the holding unit 13 rotatably holds the entirety of the corner reflector 103, and holds the reflective diffraction grating 104 and the mirror 105 so as to be rotatable independently of each other. More specifically, the holding unit 13 includes a first mechanism 21 that holds the entirety of the corner reflector 103 so as to be rotatable around a rotation axis A1 (namely, along the main surface 11s) intersecting (orthogonal to) the main surface 11s of the base 11. The rotation axis A1 passes through an intersection point C1 at which the reflective surface 104s (extension line) of the reflective diffraction grating 104 and the reflective surface 105s (extension line) of the mirror 105 are at a right angle.

In addition, the holding unit 13 includes a second mechanism 22 that holds the reflective diffraction grating 104 so as to be independently rotatable around a rotation axis A2 along the main surface 11s and the reflective surface 104s, and that holds the mirror 105 so as to be independently rotatable around a rotation axis A3 along the main surface 11s and the reflective surface 105s. Accordingly, the second mechanism 22 can adjust the optical axis of the diffracted light L2 in each of the reflective diffraction grating 104 and the mirror 105. Further, the holding unit 13 includes a third mechanism 23 which holds the reflective diffraction grating 104 such that the reflective diffraction grating 104 does not independently rotate along the main surface 11s, and which holds the mirror 105 such that the mirror 105 is independently rotatable around a rotation axis A4 (namely, along the main surface 11s) intersecting (orthogonal to) the main surface 11s and along the reflective surface 105s.

Incidentally, the grooves of the reflective diffraction grating 104 extend in the direction intersecting (orthogonal to) the main surface 11s, and are arranged along the main surface 11s. Namely, the first mechanism 21 holds the reflective diffraction grating 104 so as to be rotatable in a wavelength selection direction, and the third mechanism 23 holds the reflective diffraction grating 104 so as not to independently rotate in the wavelength selection direction. Incidentally, the holding unit 13 may further include a fourth mechanism (not illustrated) that is installed on, for example, an optical stage, a rail, or the like to hold the corner reflector 103 so as to be translatable along the X-axis direction (second direction).

Figure 4:
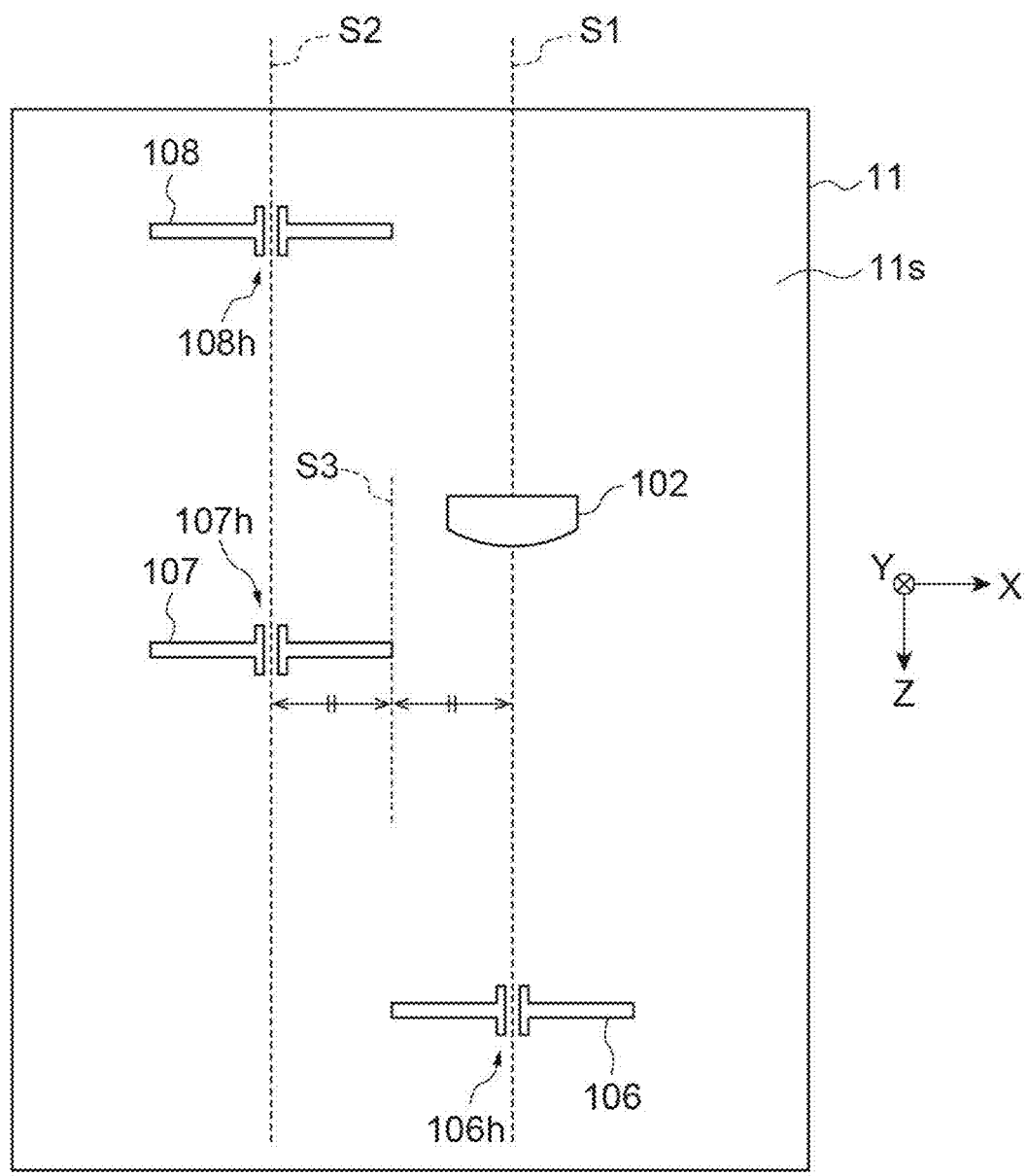
FIG. 4 is a schematic plan view illustrating each step of an optical axis adjustment method.

Subsequently, an optical axis adjustment method of the laser device 100 using the optical kit 10 described above will be described. FIGS. 4 to 7 are schematic plan views illustrating each step of the optical axis adjustment method. FIG. 4 illustrates an initial state of the method. In the method, first, as illustrated in FIG. 4, the optical components of the optical system except for the corner reflector 103 are held by the respective holding units except for the holding unit 13 which holds the corner reflector 103 among the holding units. At this time, the holding units hold the respective optical components such that the center of the lens 102 and the center of the optical aperture 106h of the iris 106 are aligned with each other on the straight line S1 and the center of the optical aperture 107h of the iris 107 and the center of the optical aperture 108h of the iris 108 are aligned with each other on the straight line S2 in the range of machining accuracy.

In addition, the distance between the lens 102 and the iris 106 and the distance between the iris 107 and the iris 108 can be secured to such an extent that the inclinations of a straight line connecting the centers of the lens 102 and the iris 106 and a straight line connecting the centers of the iris 107 and the iris 108 with respect to the straight line S1 and the straight line S2 are suppressed in a range of 1 mrad or less. For example, when the diaphragm diameters of the irises 106 to 108 are 1 mm, the distance between the lens 102 and the iris 106 and the distance between the iris 107 and the iris 108 can be set to at least 80 mm or more, as one example, 90 mm. The inclinations of the straight lines, which connect the respective centers thereof, with respect to the straight line S1 and the straight line S2 are suppressed in a range of 1 mrad or less by setting the distance between the lens 102 and the iris 106 and the distance between the iris 107 and the iris 108 to 80 mm or more. In addition, there is no upper limit to the distance between the straight line S1 and the straight line S2 as long as the optical components do not interfere with each other when being disposed on the straight lines S1 and S2. In order to avoid an increase in size of the optical system or an increase in misalignment of the beam caused by the rotation of the reflective diffraction grating 104 to be described later, the distance can be set in a range of 10 cm or less, as one example, to 40 mm.

Figure 5:
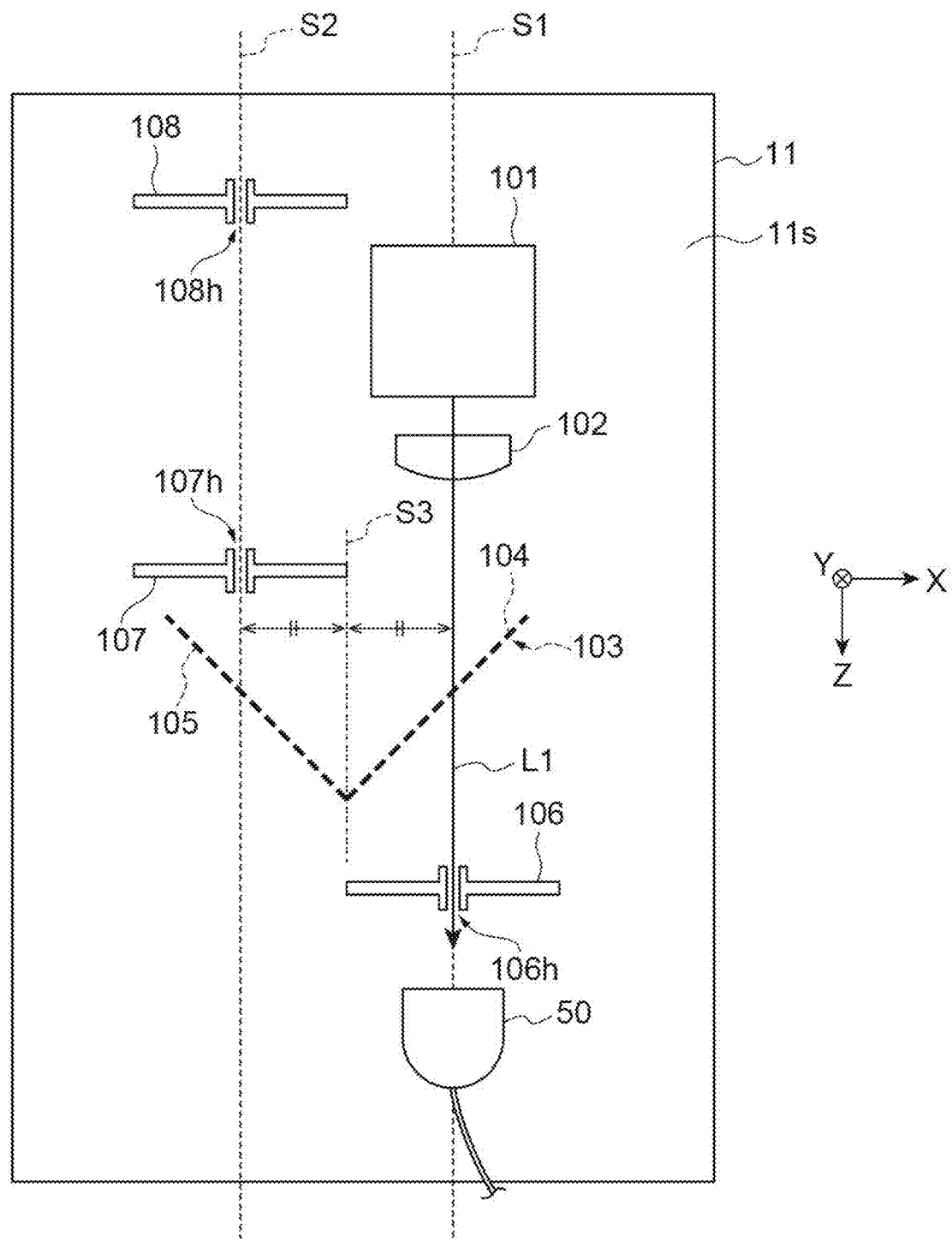
FIG. 5 is a schematic plan view illustrating each step of the optical axis adjustment method.

Subsequently, in the method, as illustrated in FIG. 5, while a state is maintained in which the corner reflector 103 is not provided, the laser light source 101 is installed by being held by the holding unit 19. The laser light source 101 is installed such that the laser light L1 which has been output passes through the optical aperture 106h of the iris 106 held by the holding unit 16 via the lens 102 held by the holding unit 12. Further, a detector 50 that can detect the light intensity of the laser light L1 which has passed through the optical aperture 106h is installed at a position on a side opposite to the laser light source 101 with respect to the iris 106.

Then, while monitoring the light intensity of the laser light L1 that has passed through the optical aperture 106h of the iris 106, the position of the laser light source 101 with respect to the lens 102 is adjusted such that the maximum value of the light intensity can be obtained. Accordingly, the alignment between the light emitting point of the laser light source 101 and the center of the lens 102 is achieved. The center of the lens 102 and the center of the optical aperture 106h of the iris 106 can be aligned with one straight line S1 in the range of machining accuracy of the base 11 and the holding unit.

The optical axis of the laser light L which is output from the laser light source 101 and passes through the lens 102 is aligned with the straight line S1 by the above step. Incidentally, in this stage, the distance between the laser light source 101 and the lens 102 is not optimized. In this stage, in order to monitor the light intensity, the distance between the laser light source 101 and the lens 102 may be adjusted such that the laser light L1 is condensed in the vicinity of the iris 106.

Figure 6:
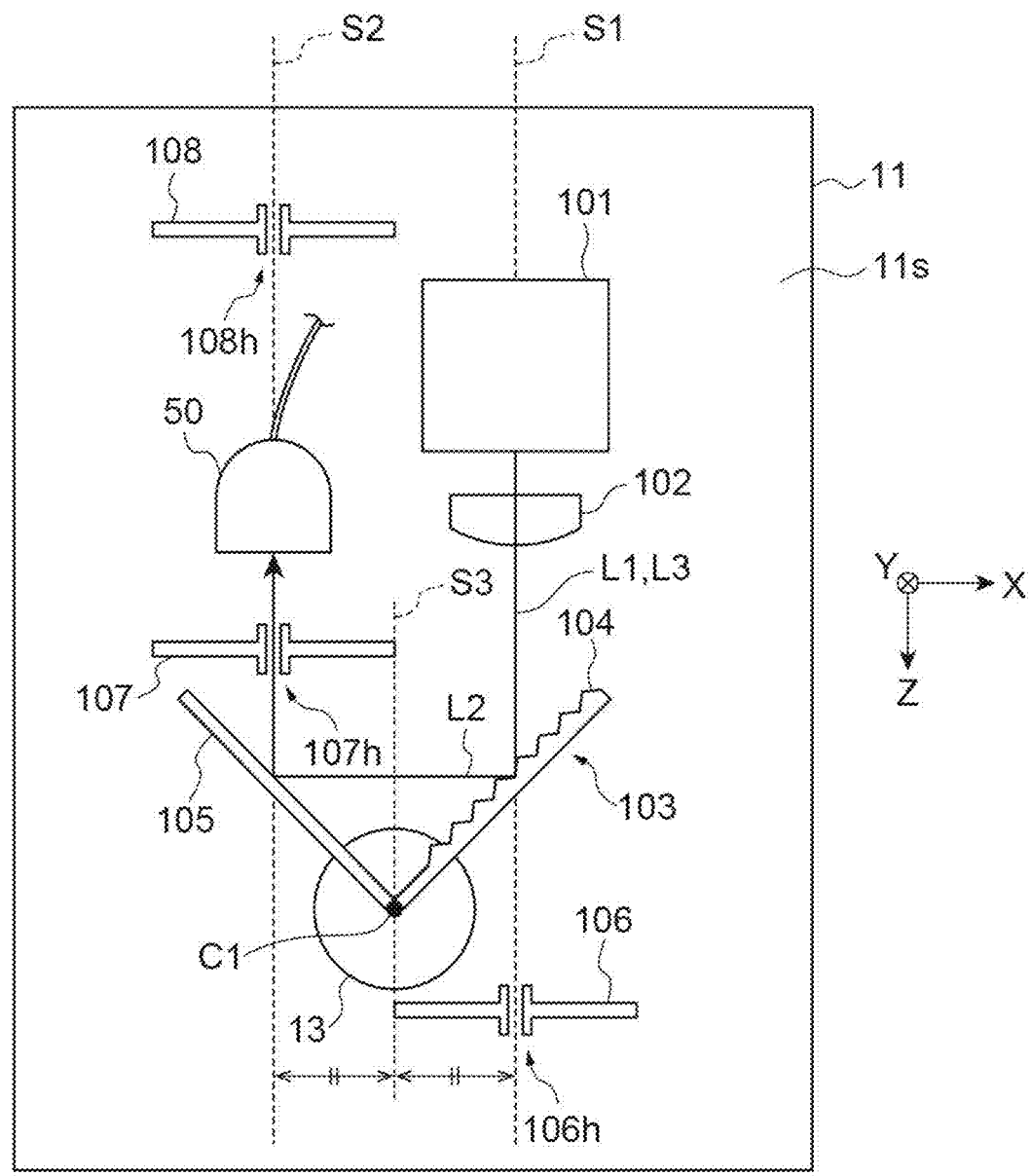
FIG. 6 is a schematic plan view illustrating each step of the optical axis adjustment method.

Subsequently, in the method, as illustrated in FIG. 6, the corner reflector 103 is installed by being held by the holding unit 13. Here, the reflective surface 104s of the reflective diffraction grating 104 and the reflective surface 105s of the mirror 105 may be substantially orthogonal to each other at the visual level. Exact orthogonality between the reflective surface 104s and the reflective surface 105s is secured, as will be described later, by way of the following steps. In addition, in this case, the angle of incidence of the laser light L1 on the reflective surface 104s can be set to an angle at which the external resonator is established between the reflective surface 104s and the laser light source 101, namely, an angle at which the first order diffracted light L3 is fed back to the laser light source 101 via the lens 102. As described above, in this stage, since the distance between the laser light source 101 and the lens 102 is not optimized, external resonance is not established, but, a return light from the reflective diffraction grating 104 partially returns to the laser light source 101, so that the light output of the laser light source 101 is increased.

Meanwhile, the detector 50 that can detect the light intensity of the diffracted light L2 which has passed through the optical aperture 107h is installed at a position on a side opposite to the corner reflector 103 with respect to the iris 107. Then, while monitoring the light intensity of the diffracted light L2 that has passed through the optical aperture 107h of the iris 107 (for example, sufficiently constricted to 1 mm or less) via the corner reflector 103, the angle of the reflective diffraction grating 104 is adjusted by the second mechanism 22 of the holding unit 13 to adjust the optical axis of the diffracted light L2 from the reflective diffraction grating 104 such that the maximum value of the light intensity can be obtained. At this time, the optical axis of the diffracted light L2 can be further adjusted by moving the entirety of the corner reflector 103 along the X-axis direction by the fourth mechanism.

Figure 7:
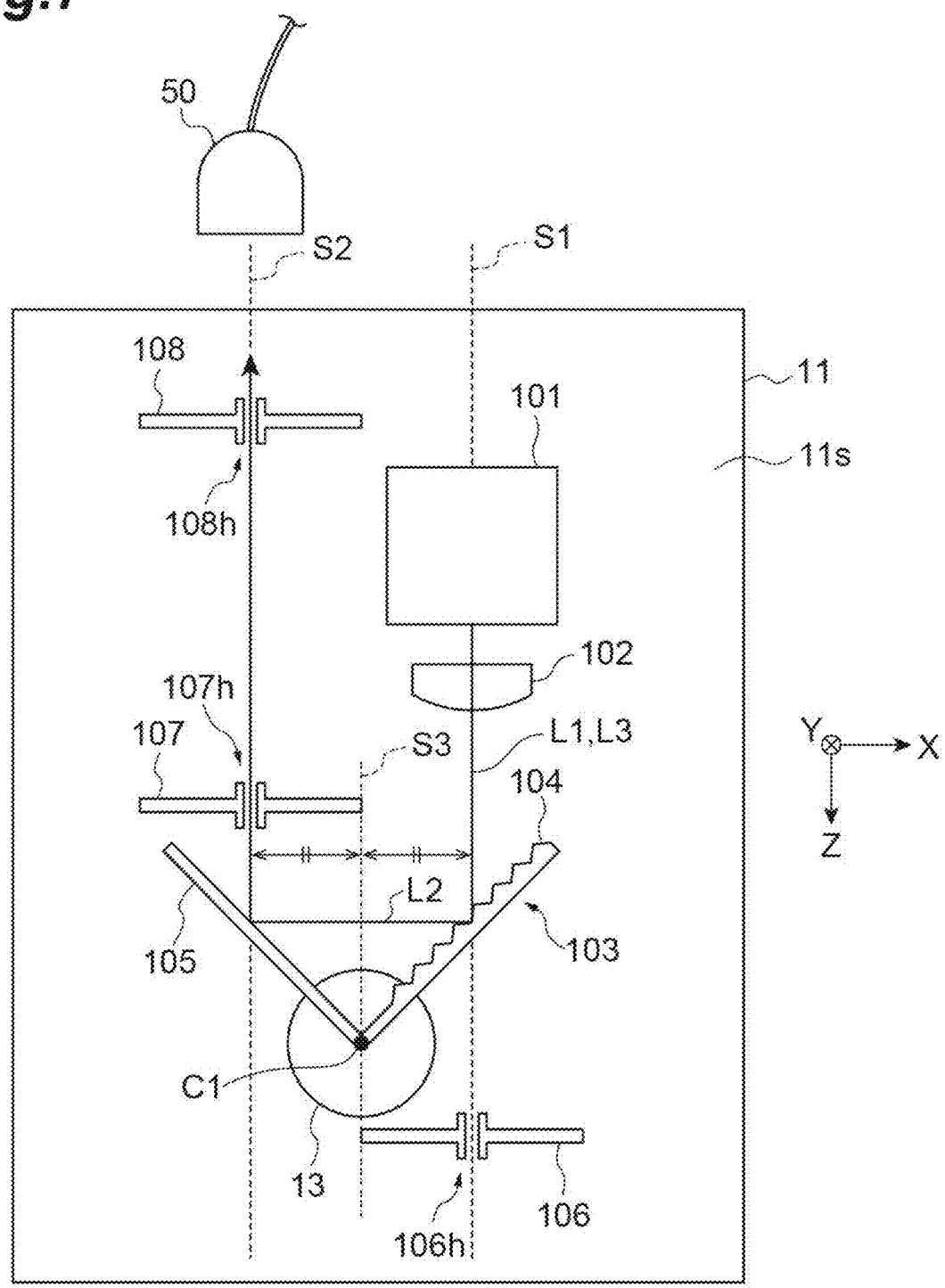
FIG. 7 is a schematic plan view illustrating each step of the optical axis adjustment method.

Subsequently, as illustrated in FIG. 7, when the maximum value of the light intensity of the diffracted light L2 which has passed through the optical aperture 107h of the iris 107 is obtained, the optical aperture 107h of the iris 107 is sufficiently expanded, and the detector 50 that can detect the light intensity of the diffracted light L2 which has passed through the optical aperture 108h is installed at a position on a side opposite to the iris 107 with respect to the iris 108. Then, while monitoring the light intensity of the diffracted light L2 that has passed through the optical aperture 108h of the iris 108 (for example, sufficiently constricted to 1 mm or less) via the corner reflector 103, the angle of the mirror 105 is adjusted by the second mechanism 22 and the third mechanism 23 of the holding unit 13 to adjust the optical axis of the diffracted light L2 from the mirror 105 such that the maximum value of the light intensity can be obtained.

The center of the optical aperture 107h of the iris 107 and the center of the optical aperture 108h of the iris 108 can be aligned with the straight line S2 in the range of machining accuracy of the base 11 and the holding unit. Therefore, the optical axis of the diffracted light L2 which has passed through the optical apertures 107h and 108h of the irises 107 and 108 in order can be aligned with the straight line S2 by alternately repeating adjustment of the optical axis of the diffracted light L2 while monitoring the intensity of the diffracted light L2 which has passed through the optical aperture 107h of the iris 107 and adjustment of the optical axis of the diffracted light L2 while monitoring the intensity of the diffracted light L2 which has passed through the optical aperture 108h of the iris 108.

As a result of these adjustments, the optical axis of the laser light L1 which is output from the laser light source 101 and passes through the lens 102 and the optical axis of the diffracted light L2 which passes through the optical apertures 107h and 108h of the irises 107 and 108 via the corner reflector 103 can be aligned with two respective straight lines S1 and S2 parallel to each other. In addition, accordingly, orthogonality between the reflective surface 104s of the reflective diffraction grating 104 and the reflective surface 105s of the mirror 105 is guaranteed, and the position and the direction of the output light (diffracted light L2) are fixed when the wavelength of the output light is selected by rotating the corner reflector 103 using the first mechanism 21.

Finally, in the method, in a state where the optical apertures 107h and 108h of the irises 107 and 108 are sufficiently expanded, the distance between the laser light source 101 and the lens 102 is adjusted such that the light intensity of the diffracted light L2 which has passed through the optical aperture 108h is maximized at an arbitrary distance from the iris 108. Accordingly, the laser light L1 from the laser light source 101 is collimated by the lens 102, and the laser light source 101 and the reflective diffraction grating 104 are optically coupled to establish external resonance having the reflective diffraction grating 104 as one end of the resonator. As described above, according to the method, the optical axis of the external resonator can be adjusted merely by performing work to cause the light to pass through the irises 106 and 107 in order after installing the laser light source 101.

As described above, according to the optical kit 10, the position and the direction of the output light can be easily adjusted in such a manner, and the configuration can be easily realized in which the position and the direction of the output light are fixed when the wavelength of the output light is selected.

Incidentally, in the above configuration, in order to prevent the occurrence of misalignment of the optical axis of the diffracted light L2 reflected by the mirror 105 even when the angle of the reflective diffraction grating 104, namely, the angle of the corner reflector 103 is changed, it is necessary that the reflective surfaces 104s and 105s of the reflective diffraction grating 104 and the mirror 105 are at a right angle, and the rotation center (position of the rotation axis A1) of the corner reflector 103 is disposed equidistant from the straight line S1 and the straight line S2.

However, these conditions are naturally established as a result of the optical axis adjustment method for aligning the optical axis with the two parallel straight lines S1 and S2. The external resonator can be established merely by performing the adjustment of the optical axis according to the above procedure, and at the same time, a change in position or direction of the beam caused by the rotation of the corner reflector 103 can be suppressed. In the optical axis adjustment method, the reason for adopting an approach of adjusting the reflective diffraction grating 104 and the mirror 105 using the adjustment mechanisms (the second mechanism 22 and the third mechanism 23) instead of adhering to securing exact perpendicularity between the reflective surfaces 104s and 105s in advance is that a slight inclination or misalignment which may be caused by the replacement of the laser light source or the diffraction grating or a deviation from an ideal state, which is dependent on the machining accuracy that determines the positions of the lens 102 and the irises 106 to 108 or the aperture diameters of the irises 106 to 108, is absorbed to realize the optical axis along the straight lines S1 and S2.

Incidentally, even if instead of using the configuration according to the embodiment, the corner reflector in which the reflective surface of the reflective diffraction grating and the reflective surface of the mirror are disposed at an exactly right angle is separately formed and assembled to realize a configuration in which the misalignment of the optical axis of an emitted light caused by a change in angle of the corner reflector does not occur, in order to guide the emitted light to a desired position in a desired direction, the adjustment is required to absorb the above-described inclination, misalignment, or the like, and it takes a lot of time and effort for a user to form the corner reflector having exact perpendicularity every time the reflective diffraction grating is replaced. Namely, in the present embodiment, when the laser light source or the diffraction grating is replaced, the convenience of a user in performing adjustment work can be greatly improved by using the irises 106 to 108 disposed as described above and the adjustment mechanisms of the corner reflector 103.

Further, in the optical system of the present embodiment, even after the laser light source or the diffraction grating is replaced and realigned, the output light is always taken out to a position in a direction along the straight line S2 defined by the irises 107 and 108, so that the optical axis before replacement can be reproduced even after the replacement of the optical component and the accompanying alignment. Therefore, the laser light source or the diffraction grating can be replaced without affecting an external optical system that uses the laser device 100 of the present embodiment as a wavelength variable light source. As described above, the optical kit 10 of the present embodiment can be an optical kit that enables the optical component such as the laser light source or the diffraction grating to be easily replaced and aligned.

Figure 8:
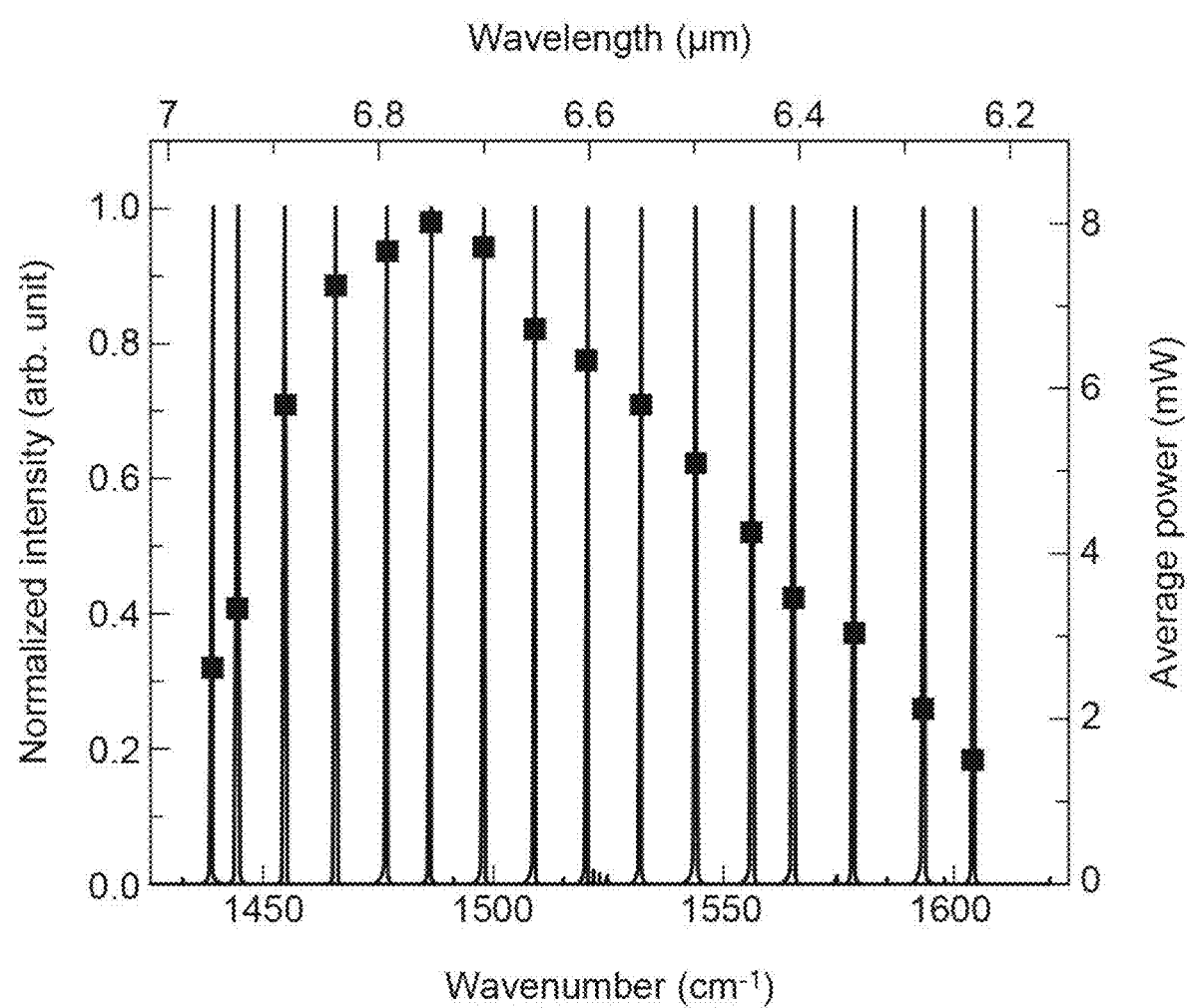
FIG. 8 is a graph showing one example of a result of performing the optical axis adjustment method using an optical kit according to the present embodiment.
Figure 9:
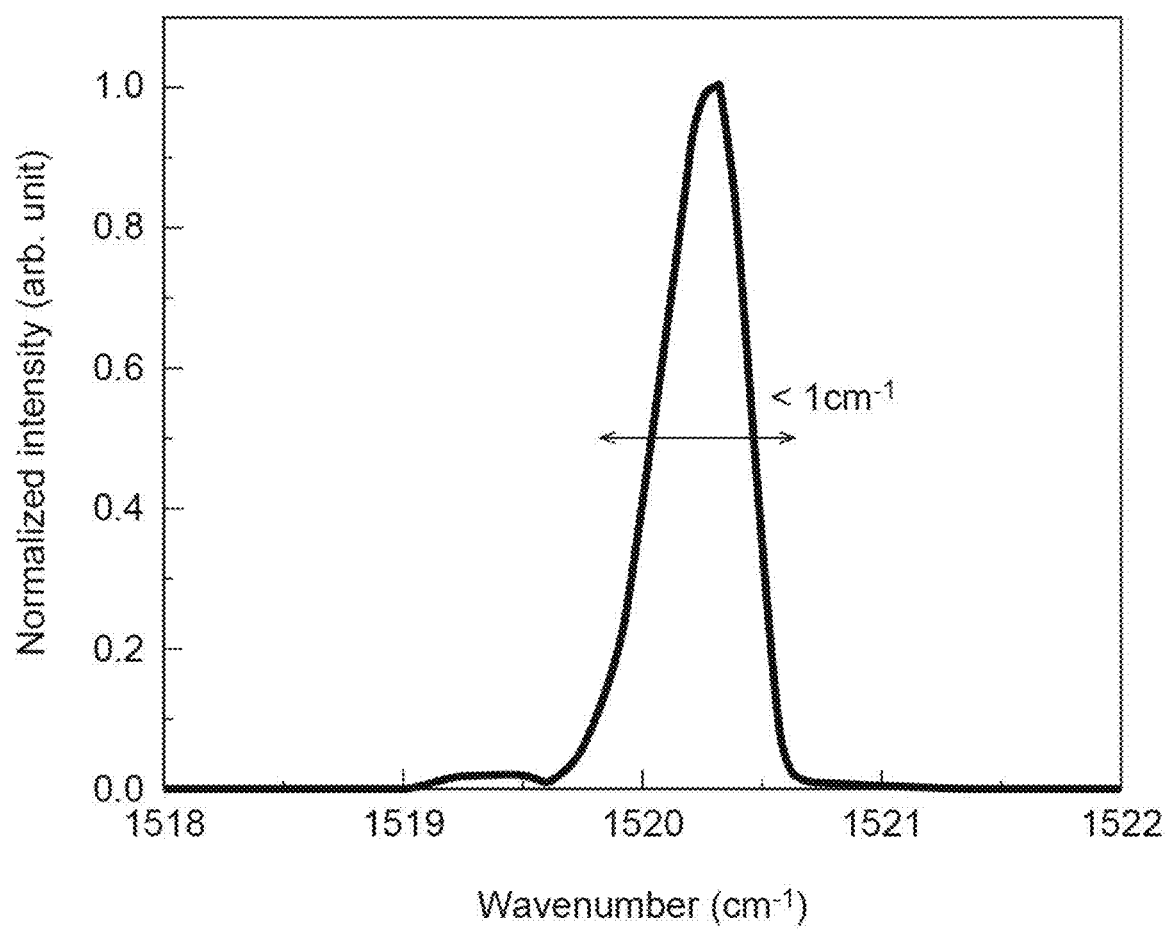
FIG. 9 is a graph showing one example of a result of performing the optical axis adjustment method using the optical kit according to the present embodiment.
Figure 10:
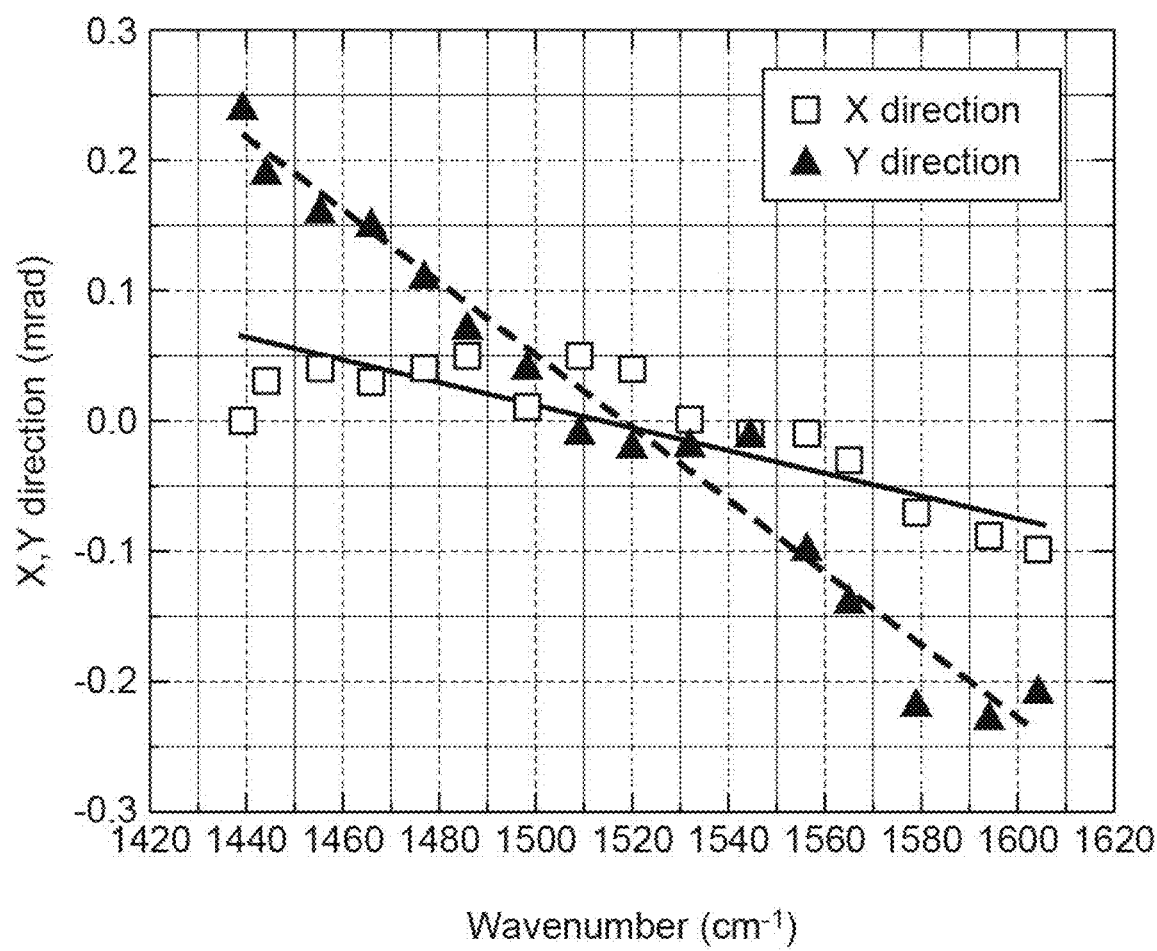
FIG. 10 is a graph showing one example of a result of performing the optical axis adjustment method using the optical kit according to the present embodiment.

FIGS. 8 to 10 are graphs showing one example of a result of performing the optical axis adjustment method using the optical kit according to the present embodiment. In FIG. 8, the lower horizontal axis represents the wavenumber, the upper horizontal axis represents the wavelength, the left vertical axis represents the normalized light intensity, and the right vertical axis represents the average power. Each plot in the graph of FIG. 8 shows average power for the peak wavelength (wavenumber) of each light intensity. FIG. 9 is an enlarged graph of a part of FIG. 8. As shown in FIGS. 8 and 9, according to the adjustment of the optical axis using the optical kit 10, the laser device 100 can be realized in which the oscillation wavelength can be freely selected in a wavelength (wavenumber) range exceeding 150 cm$^{-1}$ in a single mode having a full width at half maximum of less than 1 cm$^{-1}$.

In FIG. 10, the horizontal axis represents the wavenumber, and the vertical axis represents the amount of deviation of the output light from the center in the X-axis direction and the Y-axis direction. As shown in FIG. 10, according to the adjustment of the optical axis using the optical kit 10, the laser device 100 can be realized in which the misalignment of the output light is suppressed in a range of 0.5 mrad in both the X-axis direction and the Y-axis direction when the wavelength is selected in a wavelength (wavenumber) range exceeding 150 cm$^{-1}$. As described above, when the optical kit 10 is used, an external resonator light source can be provided which can be adopted for accurate measurement such as spectroscopy.

The above embodiment has been described as one example of the present disclosure. Therefore, the present disclosure is not limited to the optical kit 10 and the laser device 100, and can be arbitrarily changed. Subsequently, modification examples of the present disclosure will be described.

Figure 11:
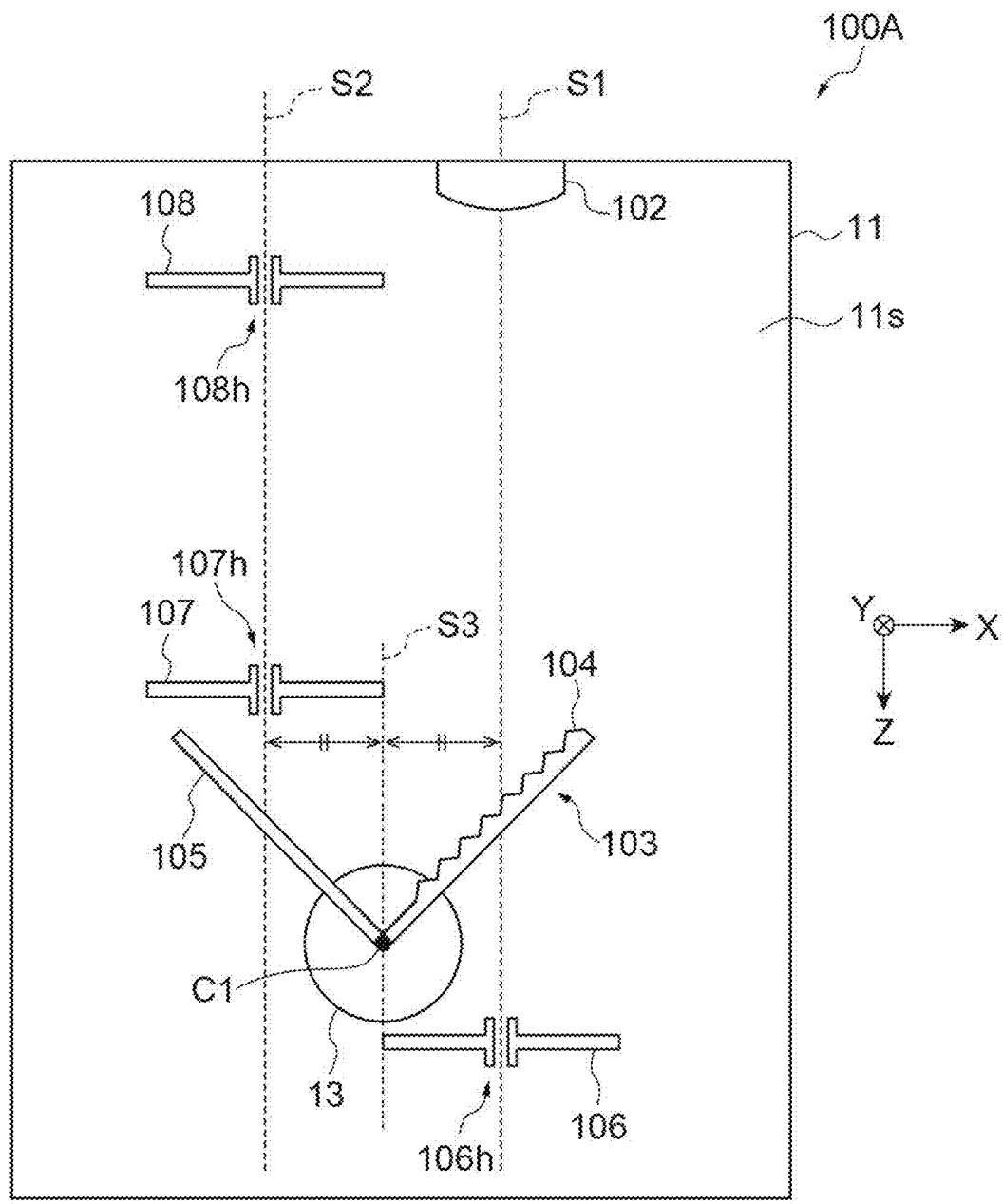
FIG. 11 is a schematic plan view illustrating an optical device according to a first modification example.

FIG. 11 is a schematic plan view illustrating an optical device according to a first modification example. As illustrated in FIG. 11, an optical device 100A does not include a laser light source. Therefore, an optical kit forming the optical device 100A does not include a holding unit that holds the laser light source. Other points of the optical kit according to this modification example are the same as those of the optical kit 10. In this case, in the optical kit, the holding unit 12 which holds the lens 102 is disposed in an edge portion of the base 11, so that the distance between the lens 102 and the iris 106 can be set to a maximum value which can be set on the base 11. As a result, the accuracy of alignment for aligning the laser light L1, which passes through the optical aperture 106h of the iris 106 via the lens 102, with the straight line S1 is improved, and the accuracy of alignment for aligning the diffracted light L2 with the straight line S2 is also improved.

Figure 12:
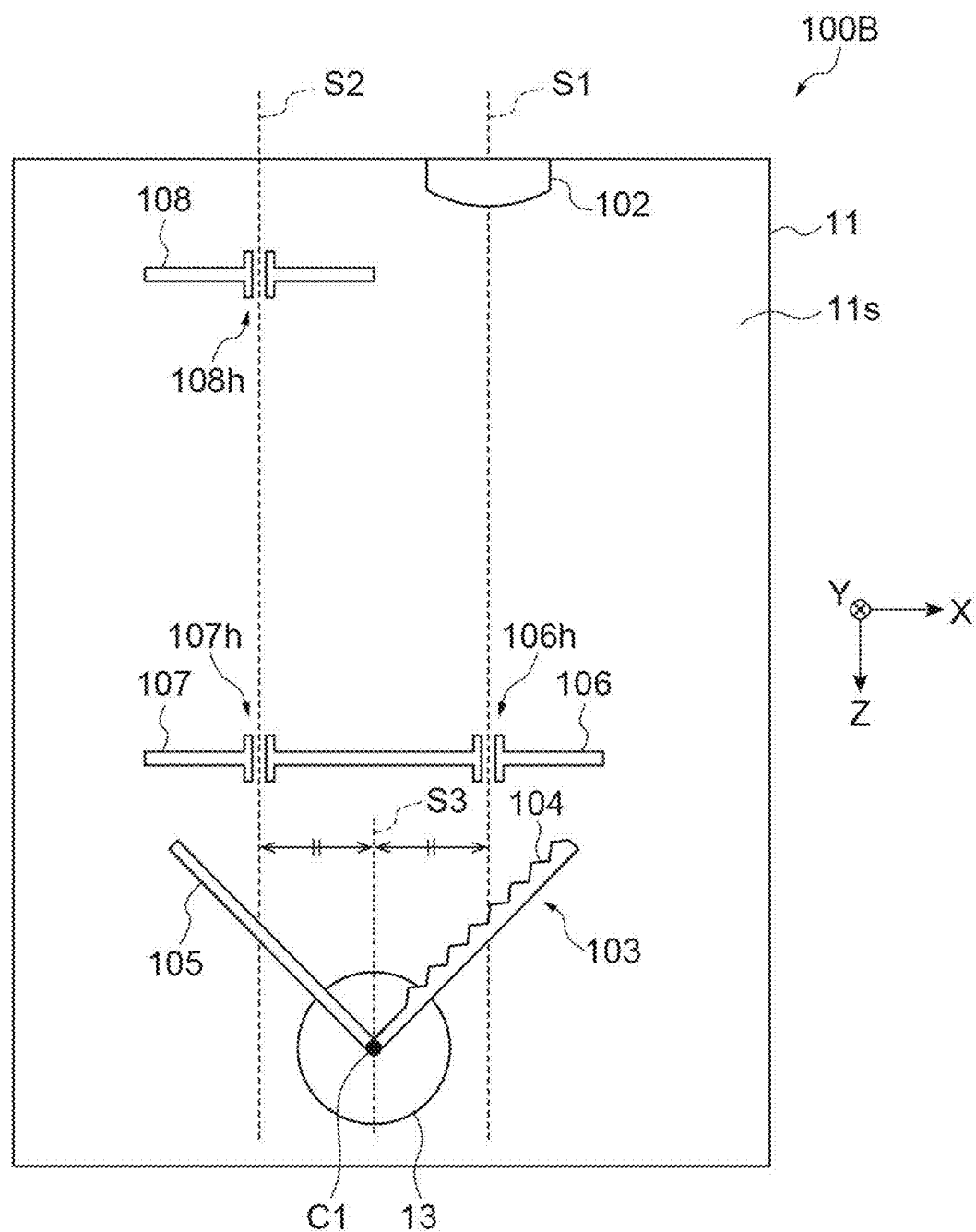
FIG. 12 is a schematic plan view illustrating an optical device according to a second modification example.

FIG. 12 is a schematic plan view illustrating an optical device according to a second modification example. As illustrated in FIG. 12, in an optical device 100B, as compared to the optical device 100A, the iris 106 and the holding unit 16 which holds the iris 106 are disposed between the corner reflector 103 (reflective diffraction grating 104) and the lens 102. Other points of the optical device 100B are the same as those of the optical device 100A. As described above, when the distance between the lens 102 and the iris 106 can be sufficiently secured on the base 11, the iris 106 and the holding unit 16 may be disposed between the reflective diffraction grating 104 and the lens 102. In this case, the reflective diffraction grating 104 (corner reflector 103) can be located on an edge portion side of the base 11, and the distance between the lens 102 and the reflective diffraction grating 104 can be increased. As a result, the accuracy of selection of a wavelength in the external resonator is improved. Incidentally, in this case, the iris 107 and the iris 106 may be integrated and held by a single holding unit.

In addition, in the laser device 100 and the optical devices 100A and 100B, the holding unit 13 is not limited to a configuration in which the corner reflector 103 is integrally attached and detached. The holding unit 13 may detachably hold only the reflective diffraction grating 104 in the corner reflector 103.

In addition, instead of the irises 106 to 108, aperture members such as pinholes may be used which do not have a diaphragm function, namely, do not have a function of adjusting the size of the optical apertures 106h to 108h. In this case, the holding units 16 to 18 may hold the aperture members such as pinholes so as to be removable from the optical path of the laser light L1 or the diffracted light L2. Namely, the irises 106 to 108 can be any members that can form optical apertures in the optical path of the laser light L1 or the diffracted light L2.

Further, a method for monitoring the light intensity of the laser light L1 or the diffracted light L2 during adjustment of the optical axis can lightethod using a thermosensitive pigment or the like instead of using the detector 50.

INDUSTRIAL APPLICABILITY

There are provided the optical kit with which the position and the direction of the output light can be easily adjusted, and the optical device.

REFERENCE SIGNS LIST

10: optical kit, 11: base, 11s: main surface, 12: holding unit (lens holding unit), 13: holding unit (reflector holding unit), 16: holding unit (first aperture member holding unit), 17: holding unit (second aperture member holding unit), 18: holding unit (third aperture member holding unit), 19: holding unit (light source holding unit), 21: first mechanism, 22: second mechanism, 23: third mechanism, 100: laser device (optical device), 100A, 100B: optical device.

The invention claimed is:

1. An optical kit forming an optical system including an external resonator of a laser light source that outputs a laser light, the kit comprising:
   a base including a main surface; and
   a holding unit provided on the main surface and configured to hold the optical system,
   wherein the optical system includes a lens into which the laser light is input in a first direction,
   a corner reflector including a reflective diffraction grating configured to reflect a diffracted light of the laser light, which has passed through the lens, in a second direction intersecting the first direction, and a mirror configured to reflect the diffracted light from the reflective diffraction grating in a third direction opposite to the first direction,
   a first aperture member disposed to form an optical aperture through which the laser light which has passed through the lens passes when the corner reflector is not installed, and
   a second aperture member and a third aperture member arranged in the third direction to form optical apertures through which the diffracted light from the corner reflector passes in order,
   the holding unit includes a lens holding unit configured to hold the lens,
   a reflector holding unit configured to hold the corner reflector,
   a first aperture member holding unit configured to hold the first aperture member,
   a second aperture member holding unit configured to hold the second aperture member, and
   a third aperture member holding unit configured to hold the third aperture member, and
   the reflector holding unit includes a first mechanism configured to hold an entirety of the corner reflector so as to be rotatable along the main surface, and
   a second mechanism configured to adjust an optical axis of the diffracted light in each of the reflective diffraction grating and the mirror.

2. The optical kit according to claim 1,
   wherein the second mechanism holds the reflective diffraction grating and the mirror so as to be rotatable around respective rotation axes along the main surface independently of each other, so that the optical axis of the diffracted light is adjustable.

3. The optical kit according to claim 1,
   wherein the reflector holding unit further includes a third mechanism configured to hold the reflective diffraction grating such that the reflective diffraction grating does not rotate along the main surface, and configured to hold the mirror such that the mirror independently rotates along the main surface.

4. The optical kit according to claim 1,
   wherein the reflector holding unit further includes a fourth mechanism configured to hold the corner reflector so as to be movable along the second direction.

5. The optical kit according to claim 1, further comprising:
   a light source holding unit configured to hold the laser light source.

6. An optical device comprising:
   the optical kit according to claim 1, wherein
   the lens is held by the lens holding unit,
   the corner reflector is held by the reflector holding unit,
   the first aperture member is held by the first aperture member holding unit,
   the second aperture member is held by the second aperture member holding unit, and
   the third aperture member is held by the third aperture member holding unit.

* * * * *